United States Patent
Sarajlic

(10) Patent No.: US 12,421,106 B2
(45) Date of Patent: Sep. 23, 2025

(54) METHOD OF MANUFACTURING A MEMS DEVICE

(71) Applicant: CYTOSURGE AG, Glattbrugg (NL)

(72) Inventor: Edin Sarajlic, Zutphen (NL)

(73) Assignee: CYTOSURGE AG, Glattbrugg (CH)

( * ) Notice: Subject to any disclaimer, the term of this patent is extended or adjusted under 35 U.S.C. 154(b) by 159 days.

(21) Appl. No.: 18/250,256

(22) PCT Filed: Oct. 21, 2021

(86) PCT No.: PCT/EP2021/079265
§ 371 (c)(1),
(2) Date: Apr. 24, 2023

(87) PCT Pub. No.: WO2022/084470
PCT Pub. Date: Apr. 28, 2022

(65) Prior Publication Data
US 2023/0416080 A1      Dec. 28, 2023

(30) Foreign Application Priority Data

Oct. 22, 2020   (NL) ..................................... 2026730

(51) Int. Cl.
*B81C 1/00*   (2006.01)
*G01Q 70/12*  (2010.01)
*G01Q 70/16*  (2010.01)

(52) U.S. Cl.
CPC ...... *B81C 1/00111* (2013.01); *B81C 1/00087* (2013.01); *G01Q 70/12* (2013.01); *G01Q 70/16* (2013.01); *B81C 2201/0133* (2013.01)

(58) Field of Classification Search
CPC ............. B81C 1/00111; B81C 1/00087; B81C 2201/0133; G01Q 70/12; G01Q 70/16
See application file for complete search history.

(56) References Cited

U.S. PATENT DOCUMENTS 5,591,665 A * 1/1997 Bodensohn ............ H10D 84/83
                                                    257/E21.573
6,093,330 A * 7/2000 Chong ................ B81C 1/00071
                                                    216/2

(Continued)

OTHER PUBLICATIONS

Sarajlic, E. et al "Fabrication of 3D Nanowire Frames by Conventional Micromachining Technology" Transducers '05, pp. 27-30, 13th Intl Conf on Solid-State Sensors, Actuators, and Microsystems, Seoul, Korea, Jun. 5-9, 2005. (Year: 2005).*

(Continued)

*Primary Examiner* — Anita K Alanko
(74) *Attorney, Agent, or Firm* — Tatonetti IP

(57) ABSTRACT

A method of manufacturing a MEMS device comprising a main body and a protrusion. To provide a generic method of manufacturing a protrusion with reduced vulnerability, the method includes creating a recess in a wafer substrate, said recess having an upper recess section and a lower recess section. The upper recess section is created using anisotropic etching and the lower recess section is formed using corner lithography followed by directional etching. Finally, a filler material is introduced in the recess and at least part of the wafer substrate material is removed so as to expose the filler material introduced in the recess. Additionally, the method allows for the batch-wise production of protrusions having oblique ends.

8 Claims, 17 Drawing Sheets

(56) References Cited

U.S. PATENT DOCUMENTS

| | | | |
|---|---|---|---|
| 2006/0165957 A1* | 7/2006 | Oesterschulze | B81C 1/00087 |
| | | | 428/156 |
| 2008/0020579 A1* | 1/2008 | Venstra | B81C 1/00158 |
| | | | 438/702 |
| 2009/0314742 A1* | 12/2009 | Kishimoto | B41J 2/1629 |
| | | | 216/27 |
| 2015/0158724 A1 | 6/2015 | Berenschot et al. | |

OTHER PUBLICATIONS

Berenschot, E. et al "3D-Nanomachining using Corener Lithography" Proceedings of the 3rd IEEE Int. Conf. on Nano/Micro Engineered and Molecular Systems, Jan. 6-9, 2008, Sanya, China, pp. 729-732. (Year: 2008).*

Burouni, N. et al "Wafer-scale fabrication of nanoapertures using corner lithography" Nanotechnology 24 (2013) 285303, published Jun. 21, 2013. (Year: 2013).*

International Search Report mailed Apr. 28, 2022 issued in connection with International Application No. PCT/EP2021/079265 (3 pages total).

International Search Report mailed Apr. 28, 2022 issued in connection with International Application No. PCT/EP2021/079265 (8 pages total).

* cited by examiner

METHOD OF MANUFACTURING A MEMS DEVICE

CROSS-REFERENCES TO RELATED APPLICATIONS

This US Non-Provisional patent application claims the benefit of and priority to PCT Application Serial No. PCT/EP2021/079265, filed Apr. 28, 2022, entitled "A Method of Manufacturing a MEMS Device," which claims the benefit of and priority to Netherlands Patent Application Serial No. 2026730, filed Oct. 22, 2020, entitled "A Method of Manufacturing a MEMS Device," the entire contents of both applications of which are hereby incorporated herein by reference.

BACKGROUND

Manufacturing of MEMS (microelectromechanical systems) devices is well known in the art, for example the manufacturing of probes like AFM (atomic force microscope) probes.

For instance, US 2006/165957 A1 describes a method for producing a small opening in a layer on a semiconductor substrate, wherein the substrate is provided on the upper side with a tapering recess which has a tip portion and side walls, and the upper side of the substrate is covered at least in the region of the recess with a layer made of an etchable material. According to the known method the opening is produced from the upper side by selective opening of the layer by means of an anisotropic plasma etching method which is matched to the material of the layer, the material, the etching gases and the etching parameters being chosen such that in the region of a tip portion of the layer, which tip portion lies on the tip portion of the substrate, a greater etching rate is produced than in the region of side walls of the layer which lie on the side walls of the substrate.

A particular type of MEMS structures comprise an oblong protrusion.

These oblong protrusions are typically vulnerable, in that they may bend in an undesirable manner (affecting the performance of the MEMS device) or even break off.

SUMMARY

The present invention relates to a method of manufacturing a MEMS device, said device comprising
 a main body, and
 a protrusion protruding from the main body;
 wherein the method comprises performing a series of steps on a monocrystalline wafer substrate.

The object of the present invention is to provide a generic method of manufacturing a protrusion with reduced vulnerability.

To this end, the invention provides a method of manufacturing a MEMS device, said device comprising
 a main body, and
 a protrusion protruding from the main body;
 wherein the method comprises performing a series of steps on a monocrystalline wafer substrate, wherein the wafer substrate comprises a first main side and a second main side opposite of the first main side; wherein the steps comprise
 creating a first recess in the wafer substrate at the first main side, said first recess comprising an upper recess section and a lower recess section, creating said first recess comprising
 creating a recess in a wafer substrate, said recess comprising an upper recess section and a lower recess section, creating said recess comprising
 creating the upper recess section in the wafer substrate using anisotropic etching,
 performing corner lithography, involving the steps of
 providing a mask at the nadir of the upper recess section,
 growing a cover layer inside the upper recess section and outside the mask,
 removing the mask at the nadir, and
 performing directional etching using the cover layer as a mask so as to form the lower recess section;
 introducing filler material in the recess, and
 removing at least part of the wafer substrate material so as to expose the filler material introduced in the recess.

Thus a protrusion of filler material is created comprising a relatively broad base provided by the upper recess section, allowing a lower (oblong) section of the protrusion as defined by the lower recess section to be shorter and hence less vulnerable.

The method may involve removal of the cover layer, for example together with the removal of as least part of the substrate but preferably before introducing the filler material.

However, the cover layer may also be used in a further step on the manufacturing of the MEMS device, and may serve as a masking layer for backside etching.

Corner lithography was introduced and used to create a nano wire pyramid (see E. Sarajlic, E. Berenschot, G. Krijnen, M. Elwenspoek, "Fabrication of 3D Nanowire Frames by Conventional Micromachining Technology", Transducers '05 [Digest of techn. Papers 13$^{th}$ Int. Conf. on Solid-State Sensors, Actuators and Microsystems], pp. 27-29).

The method is very useful for the manufacture of probes, such as AFM probes. For a probe, said main body comprises a body and a cantilever, said cantilever extending from said body, and the cantilever being provided with the protrusion.

The wafer has a first main side and a second main side. With the recess being created at the first main side, the removal of at least part of the wafer substrate material so as to expose the filler material is typically performed at the second main side, but it is feasible to do this within a cavity inside the wafer.

The protrusion may be an elongated (i.e. extending in a direction parallel to the first main side) protrusion, akin to a wall, in which case the recess is a groove so as to provide a base with a triangular cross-section. For many interesting applications the recess comprises a pyramidal recess with three or four side walls all intersecting at substantially the same location (i.e. the upper recess section is a pit).

According to a favourable embodiment, the monocrystalline substrate is silicon, and the corner lithography steps comprise
 for the step of providing the mask as the mask at the nadir of the upper recess section,
 depositing a silicon nitride layer, and
 performing corner lithography;
 for the step of growing a cover layer outside the mask at the nadir, performing thermal oxidation of silicon of the substrate; and
 for the step of removing the mask at the nadir, selective etching of silicon nitride at the bottom of the upper recess section.

Thus a convenient method is provided to manufacture a MEMS device with a protrusion that is less vulnerable.

The silicon is preferably <100> silicon.

According to a favourable embodiment, the upper recess section is a pit, and the mask at the nadir is a masking dot.

This allows for the manufacture of a probe as the MEMS device. More specifically, the embodiment allows fabrication of a narrow (cylindrical) protrusion at the apex of a pyramidal tip base, the tip base being defined by the upper recess section. In this way, we can not only obtain a mechanically robust tip (less chance to break off) but also a tip that is suitable for the access to a relatively deep part of the sample surface.

According to a favourable embodiment, —before the step of forming the recess
- the silicon substrate is provided with a layer of silicon nitride and a cover layer of silicon oxide, and
- a mask is provided and locally the silicon oxide and silicon nitride are removed so as to expose the silicon of the wafer substrate locally, and
- the step of introducing filler material comprises introducing silicon nitride as the filler material.

Thus a MEMS device, such as a probe, of silicon nitride can be formed, with a relatively broad pyramidal base and the protrusion at the apex of the pyramidal base.

According to a favourable embodiment, the step of introducing filler material comprises introducing silicon nitride as the filler material as a layer.

By providing the filler material as a layer, i.e. with a circumferentially extending inner surface in the lower recess section, a hollow protrusion is provided. A hollow protrusion can be used as a needle, which allows micro-scale manipulation of a liquid and or taking of samples, for example from a cell. It also allows for injection of a liquid, for example in a cell.

Thus, this embodiment allows for the creation of a hollow tip which can be manufactured attached to a hollow cantilever to obtain a nanopipette that can be used for the injection of biological cells. A protrusion provided according to the present invention comprising a pyramidal base with a narrow (cylindrical) lower protrusion section will cause less damage to the cells during the injection compared with a standard pyramidal tip. At the same time, the mechanical strength and stiffness of the protrusion will be largely preserved. In addition, a relatively low flow resistance of the protrusion is possible, as the lower section of the protrusion will be relatively short and the broad base of the protrusion may have a relatively large lumen.

To create the hollow needle, sacrificial silicon may be introduced as further filler material after providing the layer of silicon nitride in the recess and on the silicon wafer before covering the sacrificial silicon with further silicon nitride. The sacrificial silicon may now be removed, typically simultaneously with the removal of silicon of the substrate wafer. The distal end of the needle may be removed in a conventional manner to provide an opening at the distal end.

For a probe comprising a hollow cantilever, a cantilever recess will be formed in the substrate, and the recess will be formed in said cantilever recess. To create the hollow cantilever, sacrificial silicon will be introduced as further filler material after providing the layer of silicon nitride in the recess and on the silicon wafer before covering the sacrificial silicon with further silicon nitride. The sacrificial silicon may now be removed, typically simultaneously with the removal of silicon of the substrate wafer.

According to a favourable embodiment, the wafer substrate comprises a first main side and a second main side opposite of the first main side;
- the recess is a first recess at the first main side, and adjacent to the recess a second recess is formed in the wafer substrate at a side chosen from the first main side and the second main side, wherein creating said second recess comprises the following steps
- performing anisotropic etching so as to form a cavity with a wall of said cavity intersecting the lower recess section of the first recess provided with filler material; and
- using the plane of the wall to define a barrier and etching the filler material using said barrier.

Thus an oblique end to the protrusion of filler material in the substrate wafer is provided. In case of a tip, an oblique end may cut more easily into a cell, if it is desired to take a sample from the cell or injecting material into the cell.

This method allows for the batch-wise production of protrusions having oblique ends.

The length of the protrusion is determined by the size and the location of the cavity (distance of the second recess to the first recess).

Typically, if a hollow needle is formed, the second recess is formed after providing the first recess with sacrificial silicon as further filler material.

For a probe comprising a hollow channel in the cantilever, the wafer is provided with a silicon nitride layer protected with a silicon oxide cover layer before the second recess is formed.

In the field of taking a sample from a cell or injecting a liquid into a cell, the oblique distal end of the needle is very beneficial.

According to a favourable embodiment, the step of using the wall as a barrier comprises providing the cavity with an isotropic etchant to subject the filler material to isotropic etching.

Thus the substrate material of the wall serves a plane delimiting the etching of the filler material.

According to a favourable embodiment, the step of using the wall as a barrier comprises providing the second recess with a barrier layer and subjecting the wafer substrate to etching so as to remove said wafer substrate material.

This embodiment allows for the simultaneous removal of wafer substrate material and filler material, which is advantageous as removal of wafer substrate material is typically a step that is performed when preparing MEMS devises anyway.

Optionally, the barrier layer may be removed in the end, but it may also be part of the MEMS device. A suitable barrier layer may be formed by oxidizing silicon substrate material.

According to a favourable embodiment, to form the second recess the step of performing anisotropic etching so as to form the cavity is preceded by a step of performing directional etching locally.

This allows for a second recess having more sides, one of which will be used to intersect with the lower recess section of the first recess provided with filler material. If the second recess is formed from the first main side of the wafer, and upper side of the second recess will intersect with the filler material.

BRIEF DESCRIPTION OF THE DRAWINGS

The present invention will now be illustrated with reference to the drawing where.

DETAILED DESCRIPTION

Figure 1A:
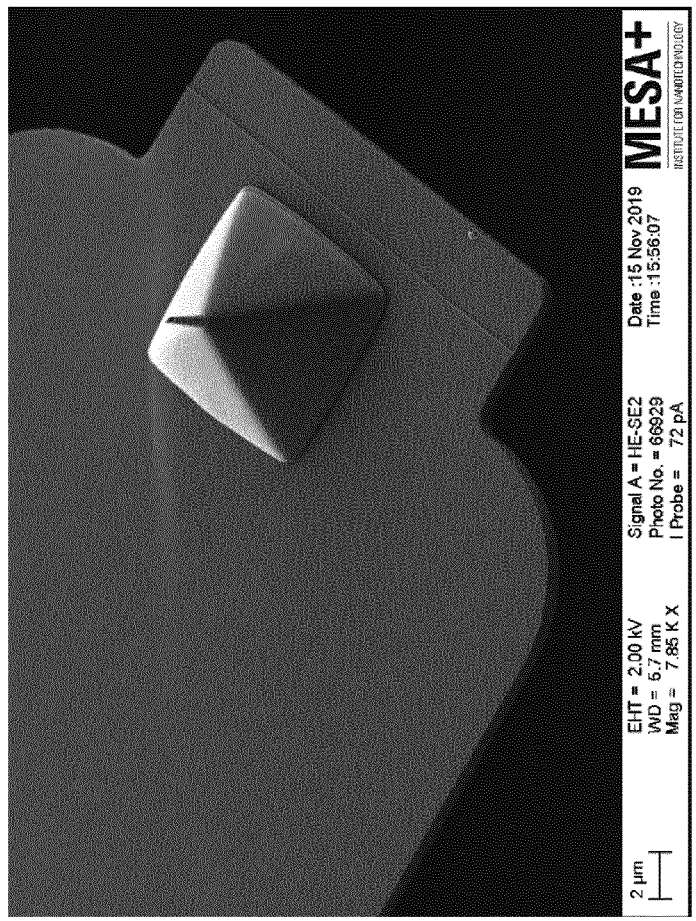
FIG. 1A to FIG. 1C show SEM photographs of a MEMS device with increasing magnification.
Figure 1B:
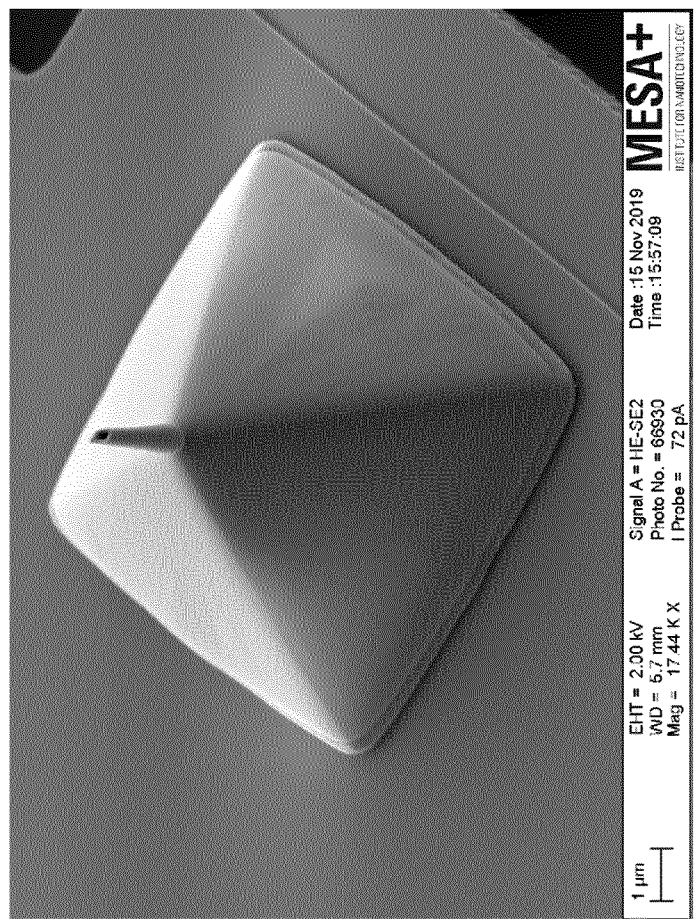
Figure 1C:
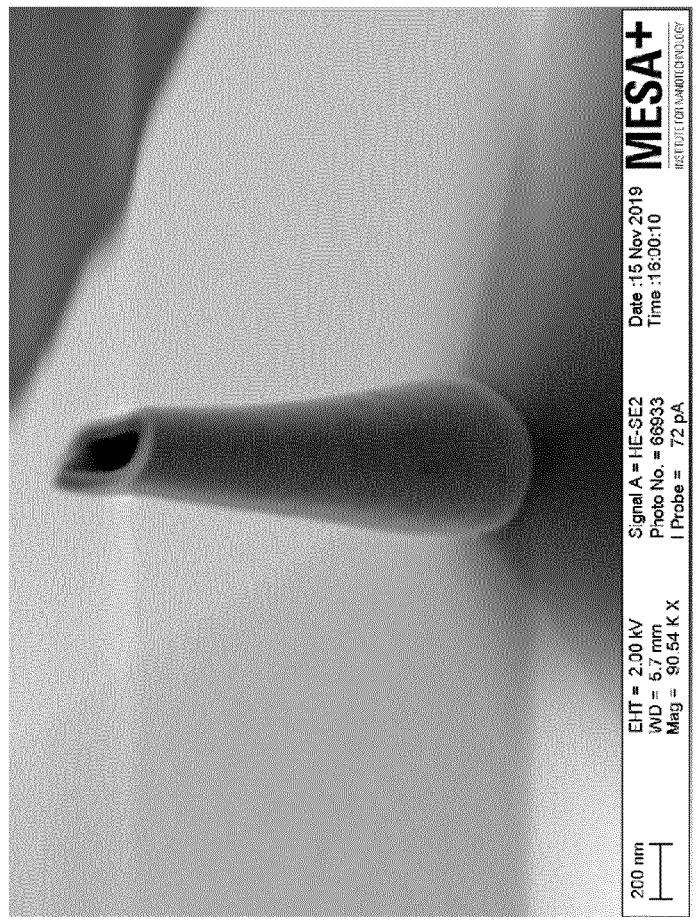

FIG. 1A to FIG. 1C show SEM photographs of a MEMS device 100 with increasing magnification, demonstrating the feasibility of the method according to the invention.

FIG. 1A shows a main body 110 (predominant gray area) provided with a protrusion 120 comprising a pyramidal base 121 and a hollow tip 122.

Figure 2A:
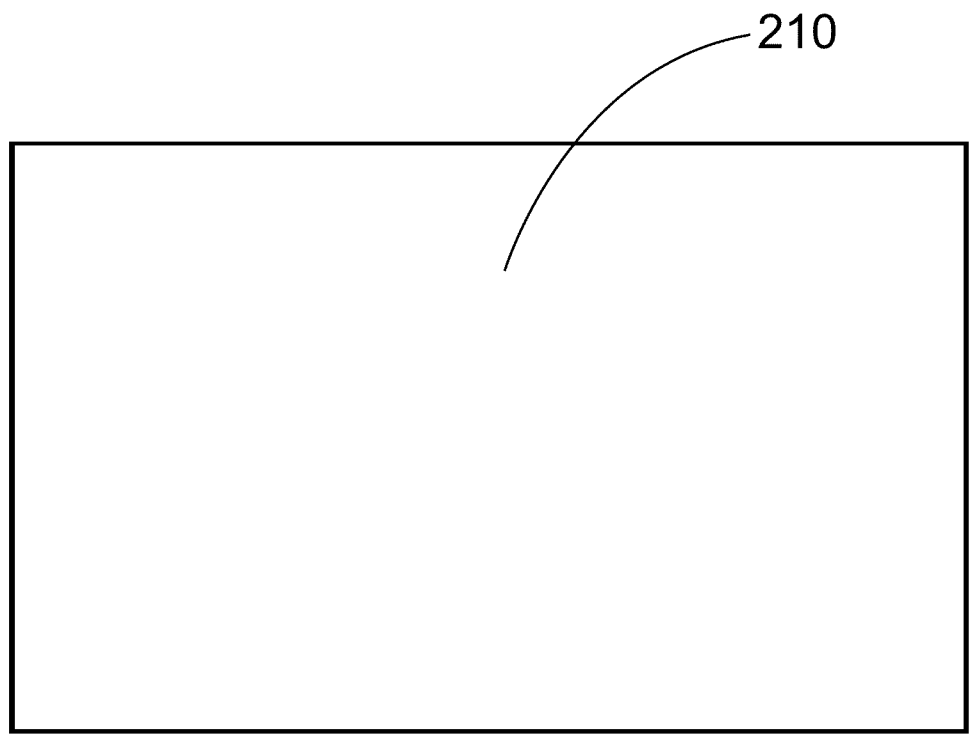
FIG. 2A through FIG. 2V show cross-sectional views through a wafer, illustrating the method to manufacture a MEMS device.
Figure 2B:
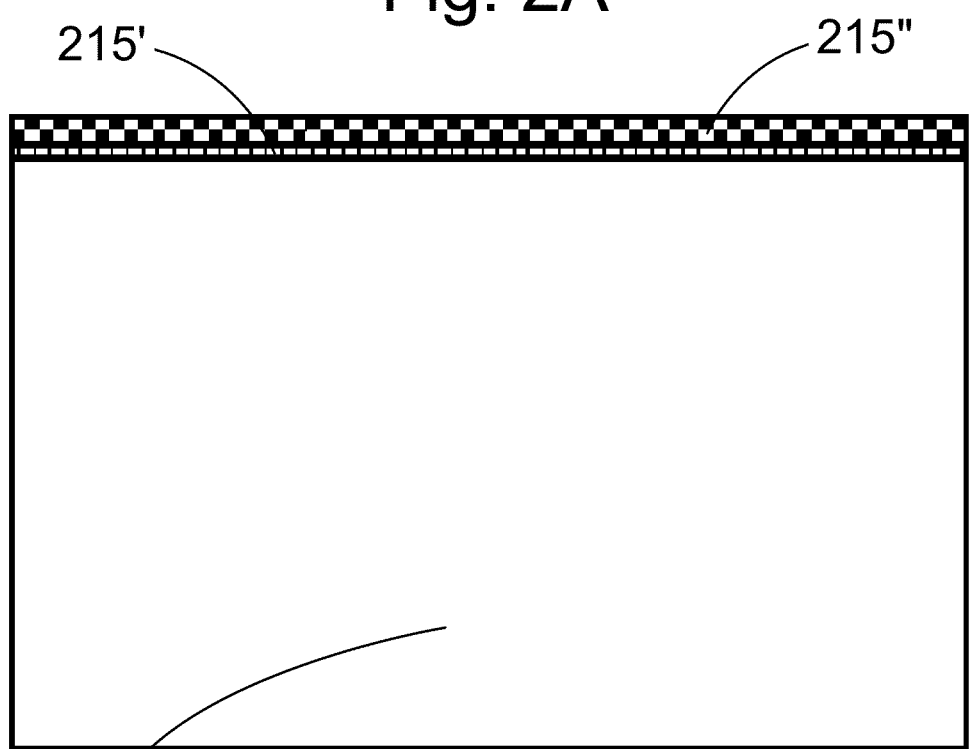
Figure 2C:
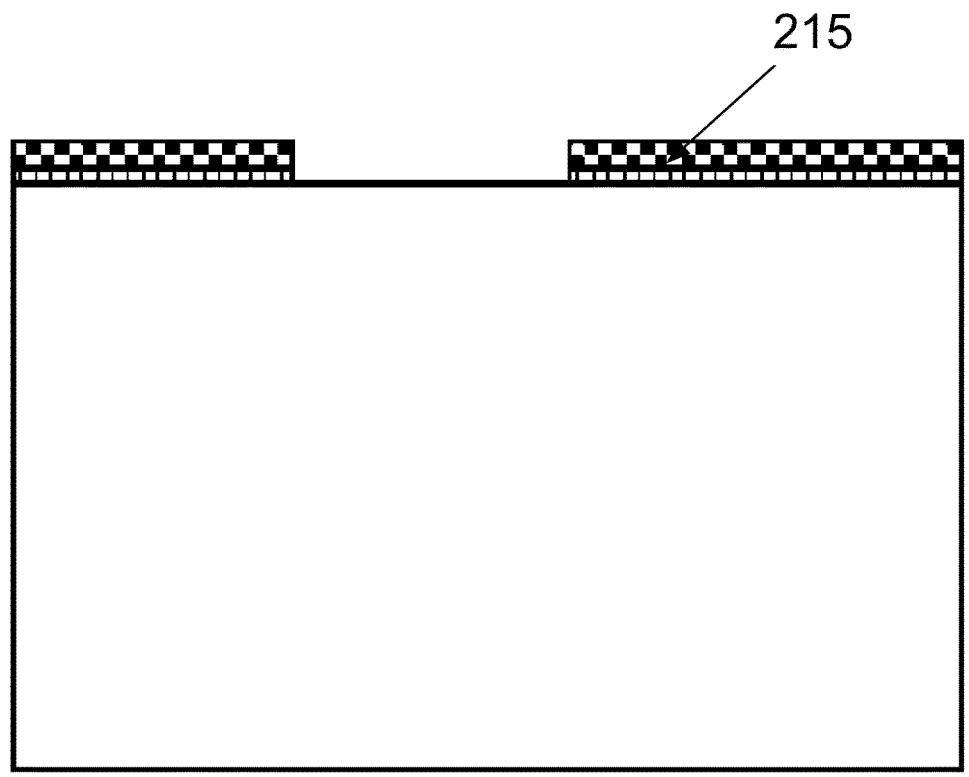
Figure 2D:
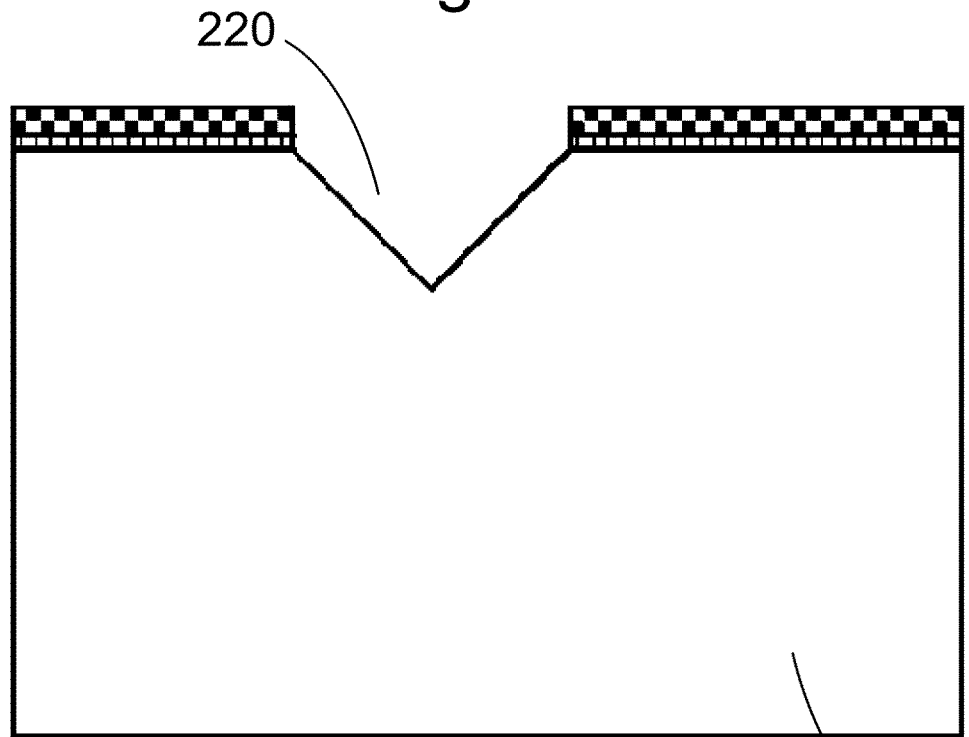
Figure 2E:
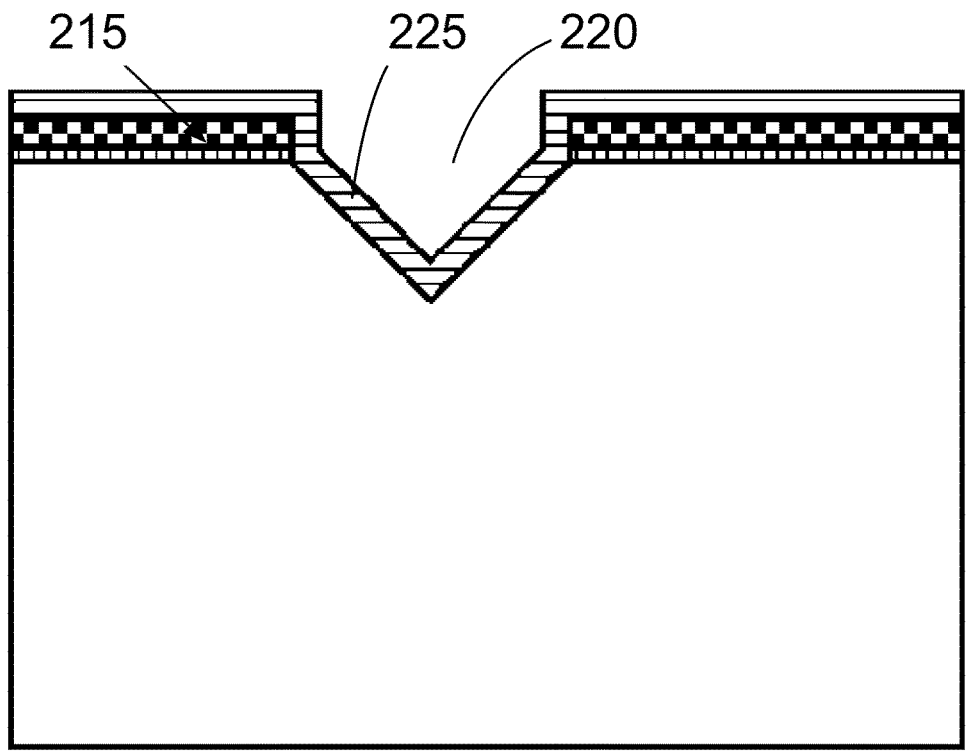
Figure 2F:
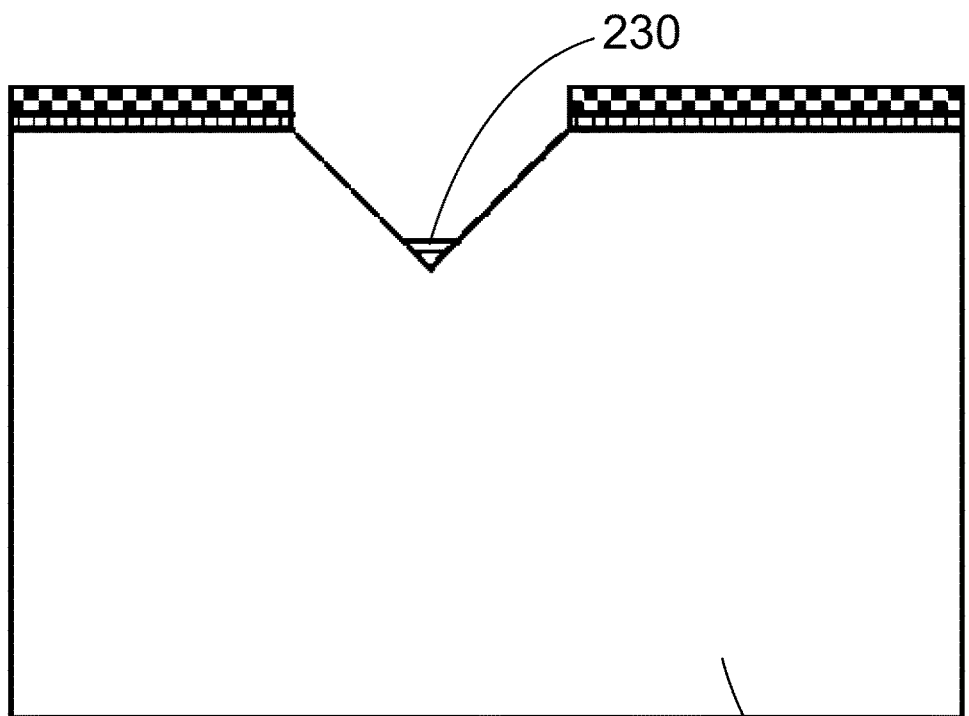
Figure 2G:
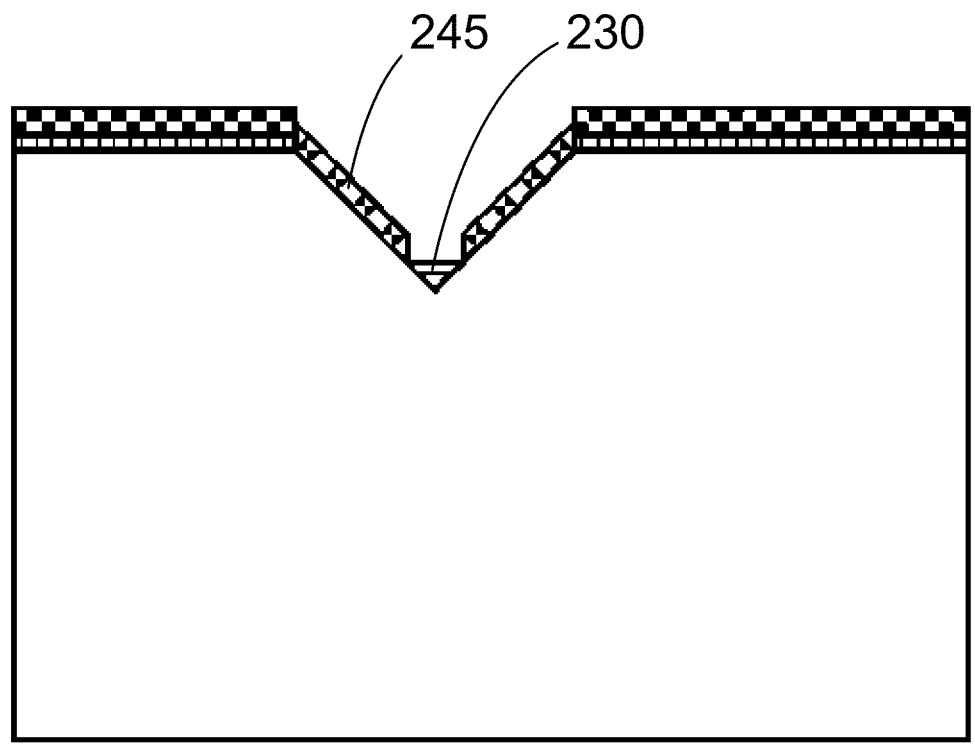
Figure 2H:
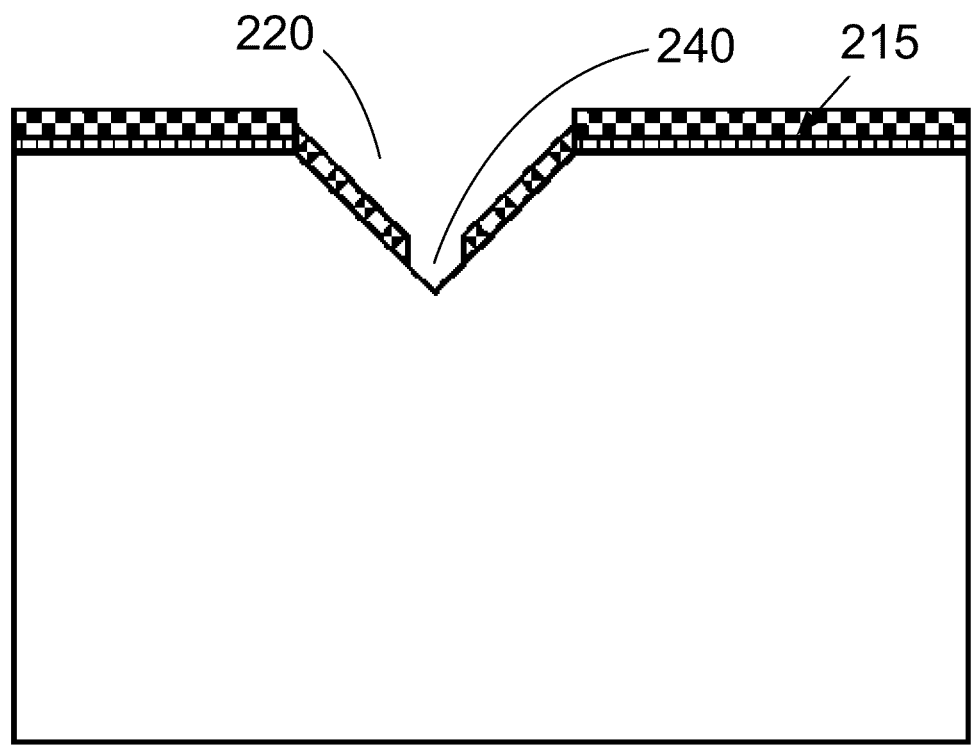
Figure 2I:
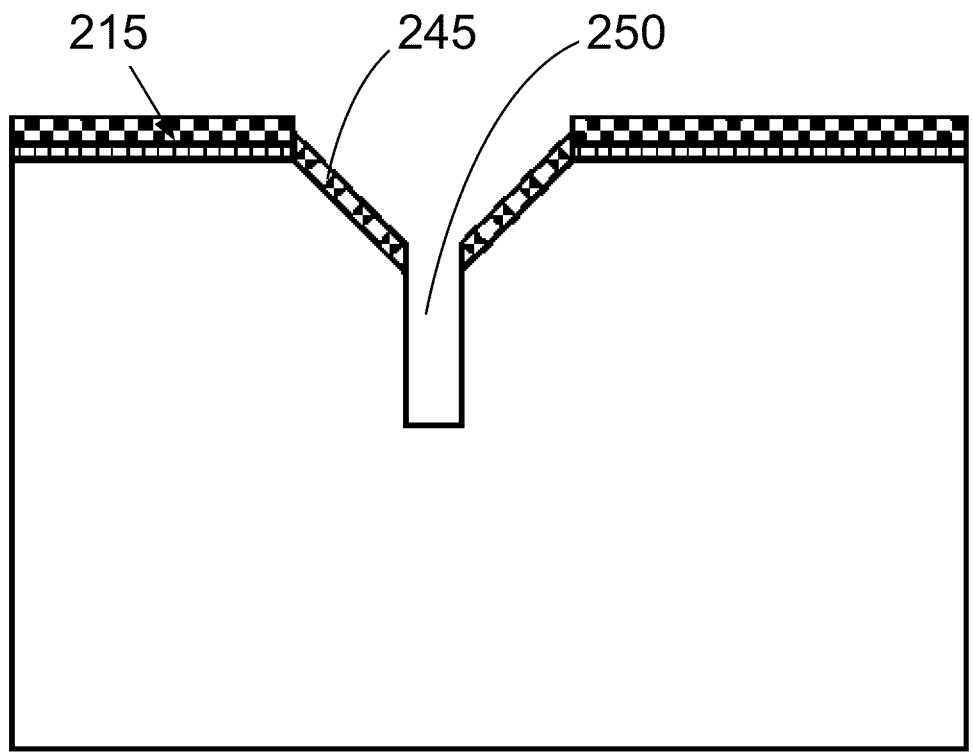
Figure 2J:
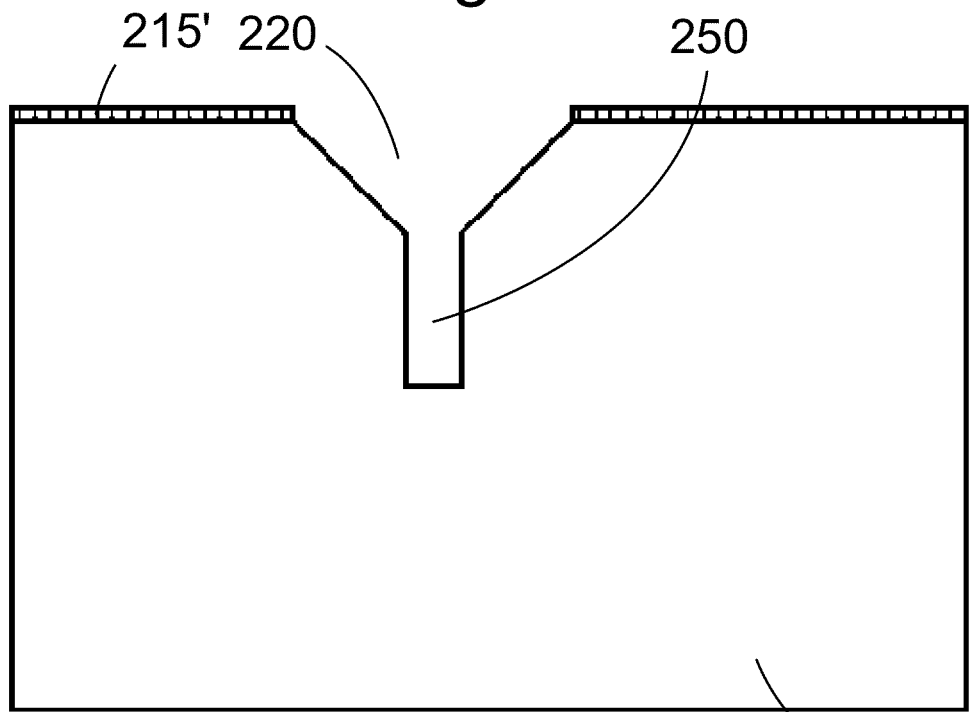
Figure 2K:
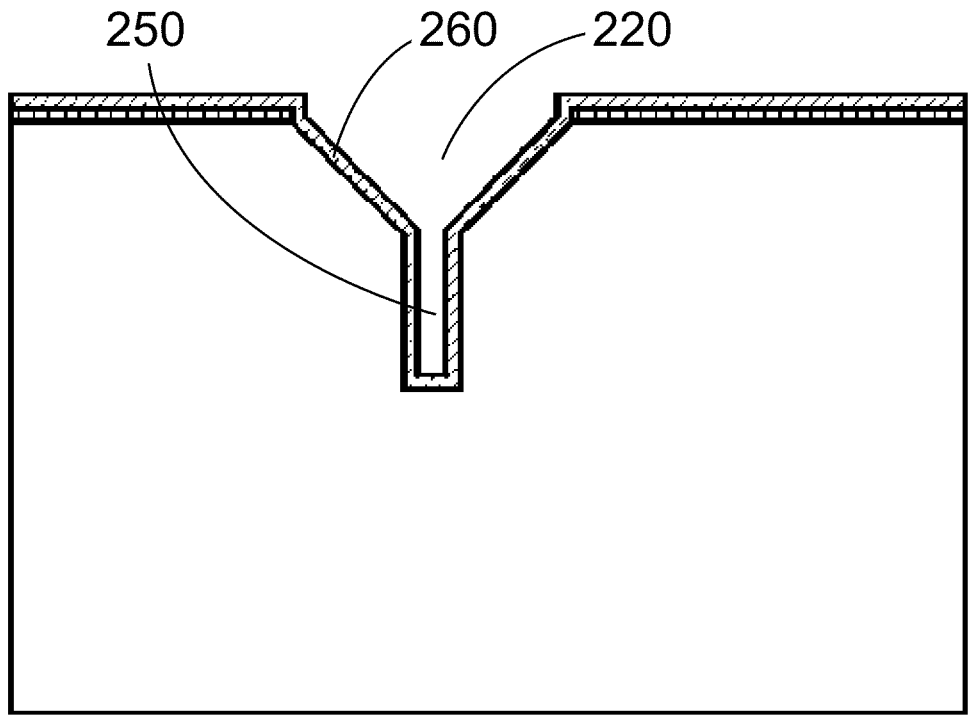
Figure 2L:
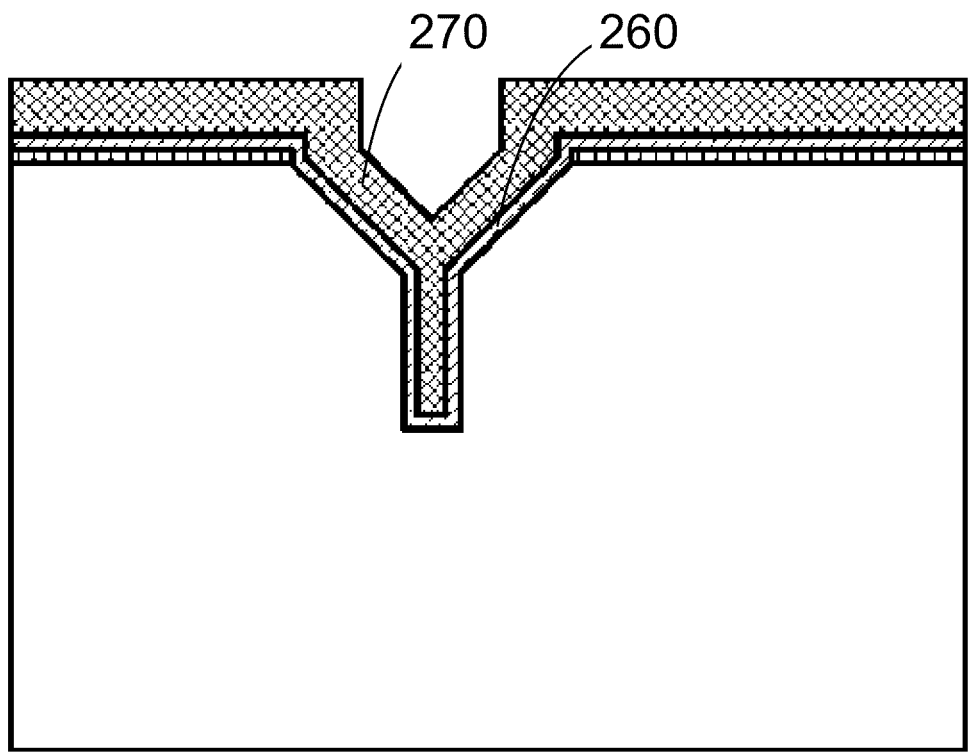
Figure 2M:
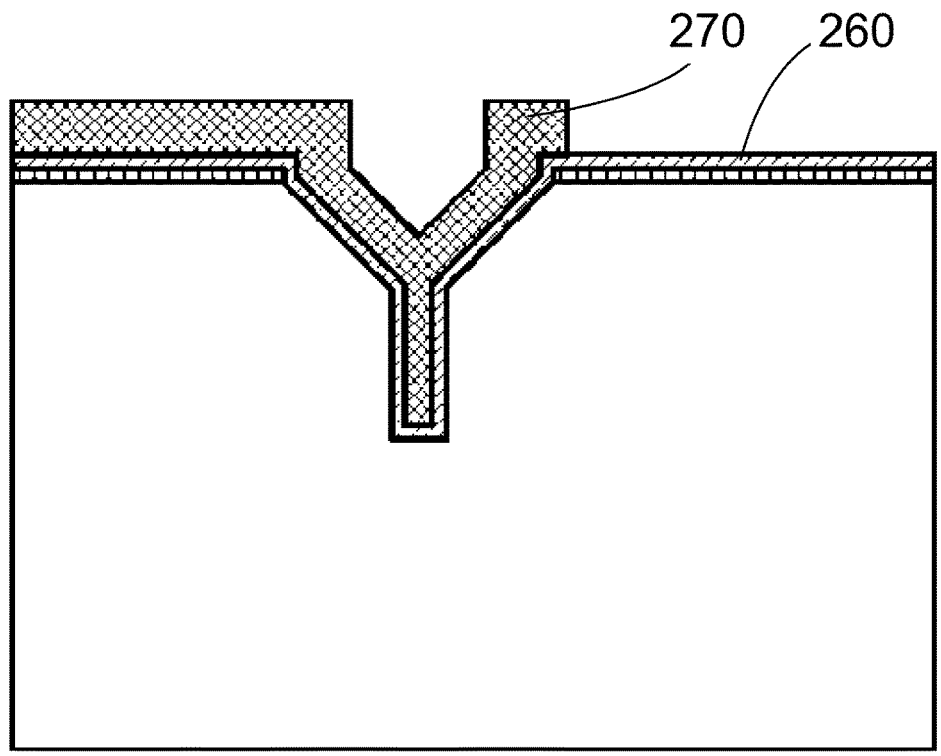
Figure 2N:
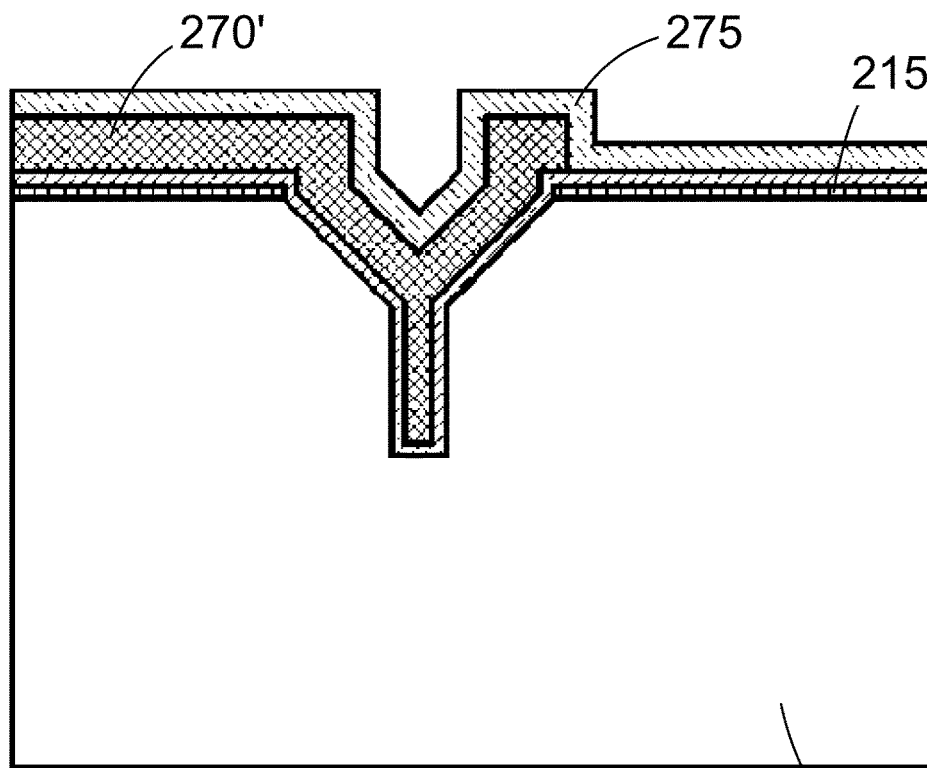
Figure 2O:
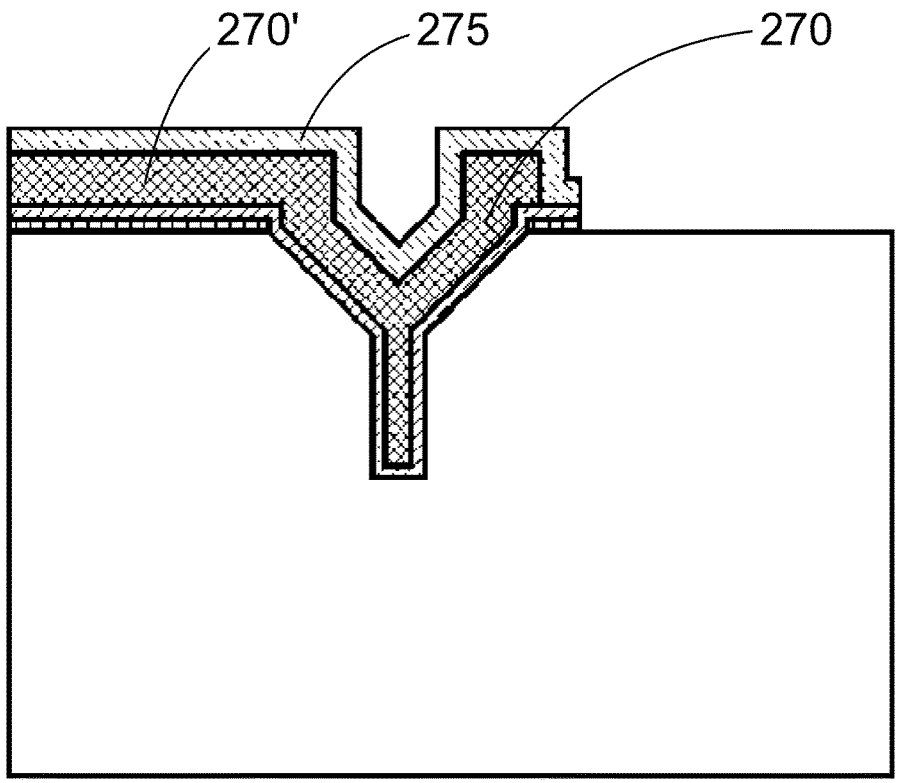
Figure 2P:
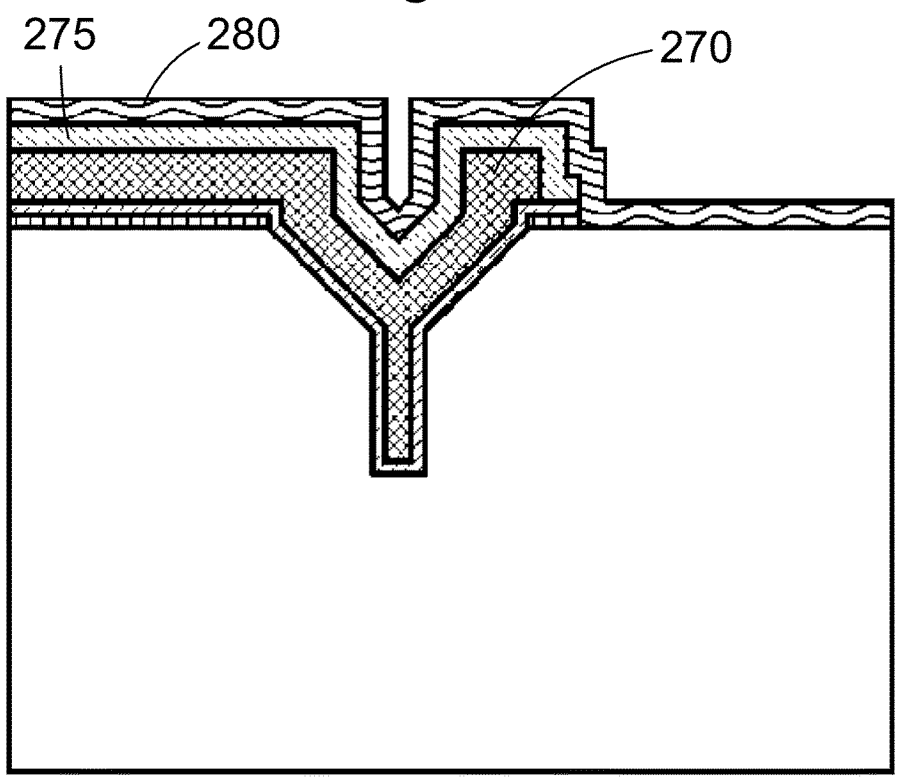
Figure 2Q:
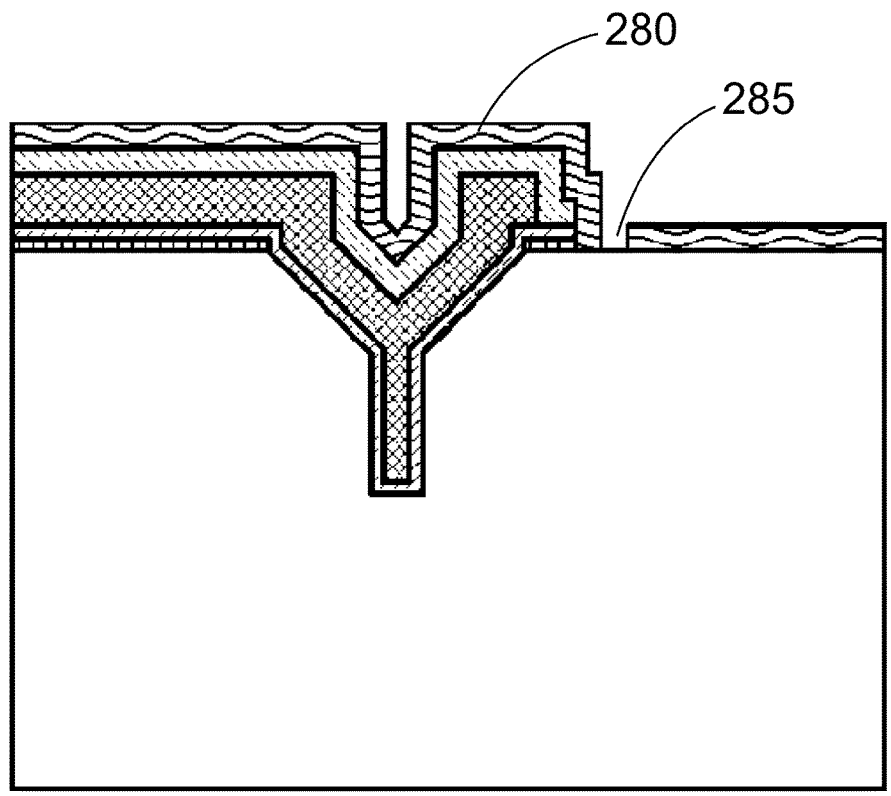
Figure 2R:
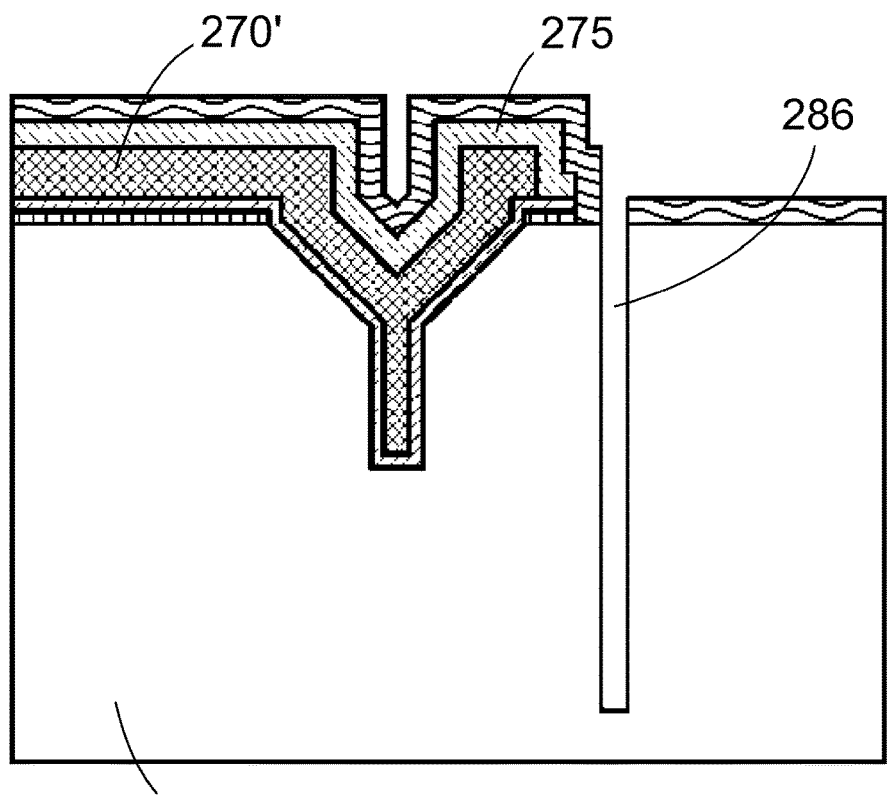
Figure 2S:
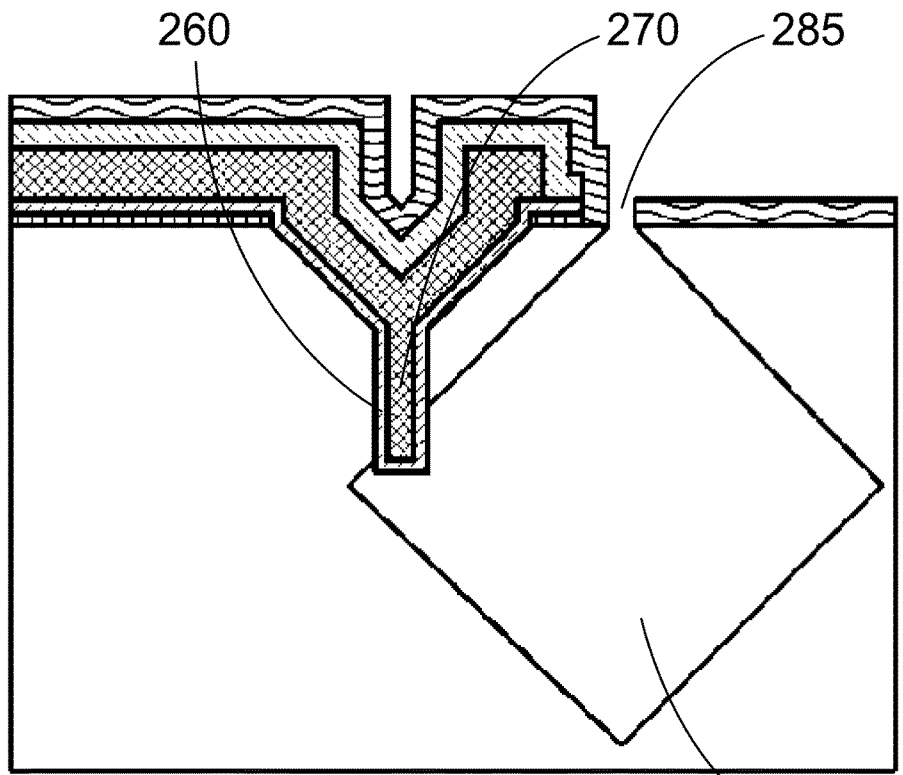
Figure 2T:
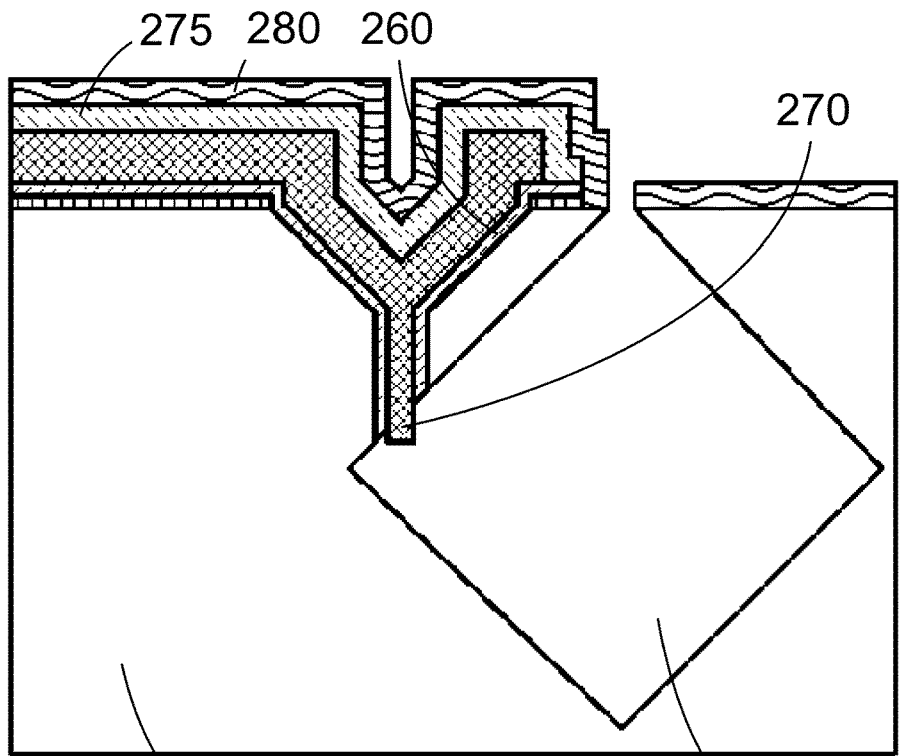
Figure 2U:
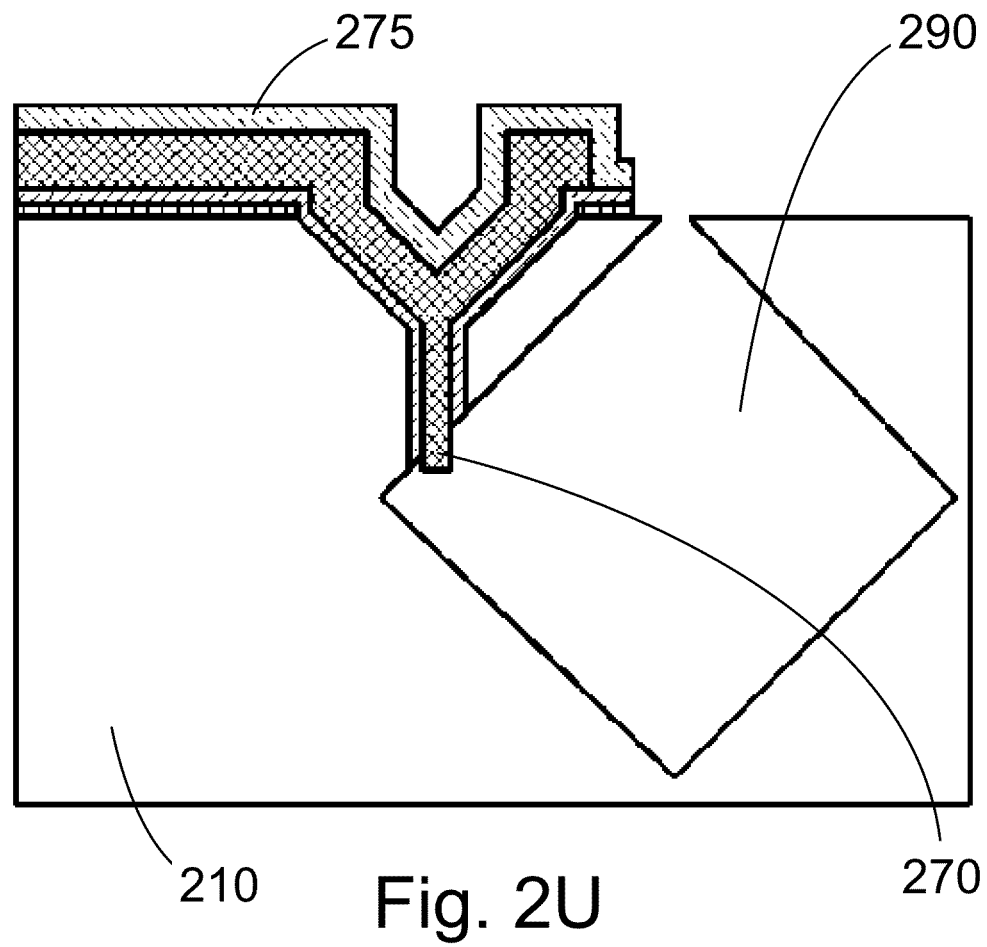
Figure 2V:
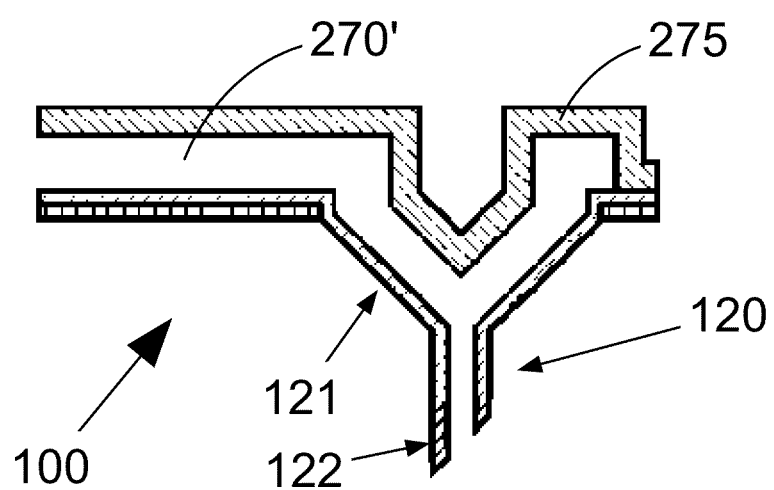

FIG. 2A through FIG. 2V show cross-sectional views through a wafer, illustrating the method to demonstrate the manufacture a MEMS device 100 (FIG. 2V).

FIG. 2A shows a wafer 210 (thickness 380 um) of single crystal silicon with a <100> crystallographic orientation.

On the silicon wafer a masking layer 215 is deposited (FIG. 2B), said masking layer 215 comprising a first masking layer 215' of silicon nitride (thickness 500 nm) and a second masking layer 215" of silicon oxide (thickness 300 nm) using Low Pressure Chemical Vapor Deposition (LPCVD). The silicon nitride layer 215' is used for protection of the silicon substrate 210 during wet anisotropic etching of silicon. The second masking layer 215" of silicon oxide is used later for protection of the silicon nitride layer during Deep Reactive Ion Etching of silicon used to form a cylindrical cavity (see FIG. 2I).

Patterning of the masking layer 215 is performed in a standard manner, using Reactive Ion Etching (RIE) (FIG. 2C), locally exposing <100> silicon of the substrate.

Where the silicon is locally exposed, pyramidal pits 220 are etched by wet anisotropic etching of silicon using 25% KOH solution at temperature of 75° C. The pyramidal pits 220 have a base of 10 um×10 um.

To perform corner lithography, first a thin (300 nm) stochiometric silicon nitride layer 225 is conformally deposited (FIG. 2E) into the pyramidal pit 220 using Low Pressure Chemical Vapor Deposition. The pyramidal pit 220 will be the upper section of a recess used as a mold for forming the protrusion.

The silicon nitride layer 225 is etched isotropically in hot phosphoric acid (85% $H_3PO_4$ at 180° C.). The timed etching in hot $H_3PO_4$ proceeds until the silicon nitride 225 is removed from all surfaces except from a small dot 230 of silicon nitride at the nadir of the pyramidal pit 220 (see "Fabrication of 3D Nanowire Frames by Conventional Micromachining Technology" (The 13th International Conference on Solid-state Sensors, Actuators and Microsystems, Seoul, Korea, Jun. 5-9, 2005) and "3D-Nanomachining using Corner Lithography" (Proceedings of the 3rd IEEE Int. Conf. on Nano/Micro Engineered and Molecular Systems Jan. 6-9, 2008, Sanya, China)). The size of the remaining silicon nitride dot depends on the original thickness of silicon nitride layer and the etching time (see "Wafer-scale fabrication of nanoapertures using corner lithography" in Nanotechnology 24(2013) 285303). In our case the size of the dot 230 is around 300 nm.

Exposed silicon of the substrate 210 is thermally oxidized (wet oxidation at 1000° C. for 1 hour) resulting in a silicon oxide layer 245 (FIG. 2G). Silicon underneath the silicon nitride dot 230 is not oxidized (LOCOS-local oxidation of silicon). The dot 230 serves as a masking dot 230.

The masking dot 230 is selectively removed by etching the silicon nitride in hot phosphoric acid (85% $H_3PO_4$ at 180° C.). Thus a small opening 240 in the silicon oxide layer 245 at the nadir of the pyramidal pit 220 is created, exposing silicon of the substrate 210.

A cylindrical cavity 250 (first recess comprises pit 220 and cylindrical cavity 250) is created (FIG. 2I) in the silicon wafer 210 by Deep Reactive Ion Etching (DRIE). The silicon oxide layers 215", 245 serve as an etching mask. The layer 215" protects silicon nitride and thermally grown silicon oxide protects silicon in the pyramidal cavity.

The size of the cylindrical cavity (depth and the diameter) depends on the etching time and the properties of the DRIE process. Background information on the DRIE process can be found here: https://en.wikipedia.org/wiki/Deep_reactive-ion_etching.

The cylindrical cavity 250 will be the lower section of the recess used as a mold for forming the protrusion.

After the DRIE etching, the silicon oxide layers 215", 245 are removed (FIG. 2J) in concentrated hydrofluoric acid (HF 50%).

To create a MEMS device 100 with a hollow protrusion 120, a layer 260 (thickness 100 nm) of silicon nitride is deposited by LPCVD into the silicon mold (FIG. 2K) formed by the pyramidal pit 220 and the cylindrical cavity 250. That is, the cavity 250 is not filled entirely. Filling the cavity 250 entirely may be preferable for scanning probes, for example, AFM probes.

A layer of sacrificial material 270, here polycrystalline silicon with a thickness of 1 um, is deposited on the wafer using LPCVD (FIG. 2L).

The sacrificial polysilicon layer 270 is patterned by Reactive Ion Etching to provide the layout of the microchannel 270' (FIG. 2M).

A further layer 275 of silicon nitride having a thickness of 600 nm is deposited, fully encapsulating the layer of sacrificial material 270 (FIG. 2N).

The silicon nitride layer 275 is subsequently patterned by Reactive Ion Etching to create the probe layout (FIG. 2O).

Next a layer 280 of silicon oxide with the thickness of 150 nm is deposited by LPCVD (FIG. 2P). This layer 280 is used as a masking for DRIE of silicon and for the protection of silicon nitride 275 during wet chemical etching in hot phosphoric acid.

The protective silicon oxide layer 280 is patterned using the standard optical lithographic method and wet chemical etching in buffered HF to obtain an access hole 285 in the silicon oxide layer 280 exposing the silicon substrate 210 (FIG. 2Q).

Through the small opening 285 in the protective silicon oxide layer 280 a trench 286 of around 40 um deep into the wafer substrate 210 is formed by DRIE of silicon (FIG. 2R).

The etching is further proceeded in hot Tetramethylammonium hydroxide (TMAH) (25% at 90° C. for 40 minutes) to form a silicon cavity 290 (second recess 290) bounded by the slow etching (111) crystallographic planes (FIG. 2S). One of the (111) planes intersects with the filled cavity 250. In this process silicon surrounding the lower part of the protrusion 120 is removed, thus exposing said lower portion of the protrusion 120.

The exposed part of silicon nitride layer 260 at the distal end of the protrusion 120 is etched by wet chemical etching in hot phosphoric acid (85% at 180° C.) as shown in FIG. 2T.

Silicon nitride on the other parts of the wafer is preserved by the protective silicon oxide layer 280.

The protective layer 280 is removed using wet chemical etching in BHF (FIG. 2U).

The wafer 210 is than anodically bonded to a glass cover (not shown in the figures) and released in hot TMAH solution. During the release the sacrificial polysilicon layer 270 is removed creating a hollow needle 120 (FIG. 2V).

FIG. 3A through FIG. 3D show cross-sectional views through a wafer, illustrating an alternative method to manufacture a MEMS device.

Figure 3A:
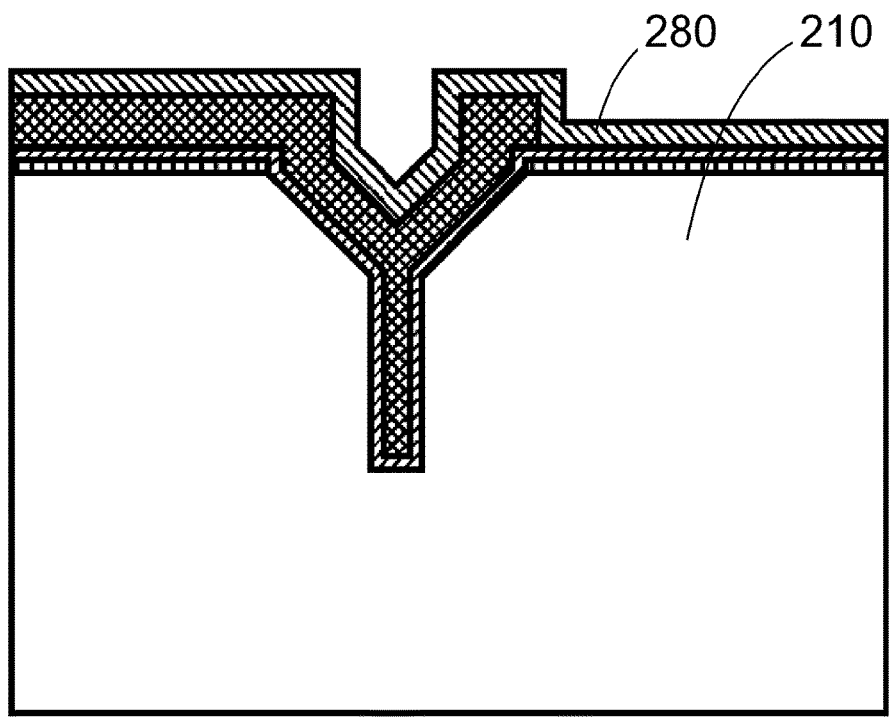
FIG. 3A through FIG. 3F show cross-sectional views through a wafer, illustrating the method to manufacture a MEMS device.

FIG. 3A corresponds substantially to FIG. 2N.

Figure 3B:
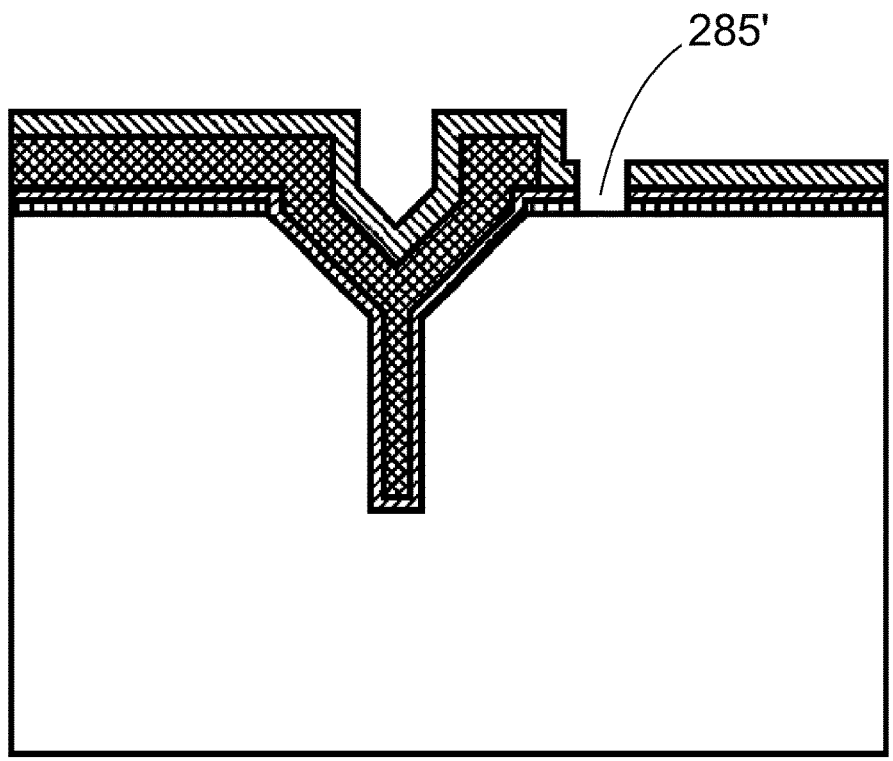
Figure 3C:
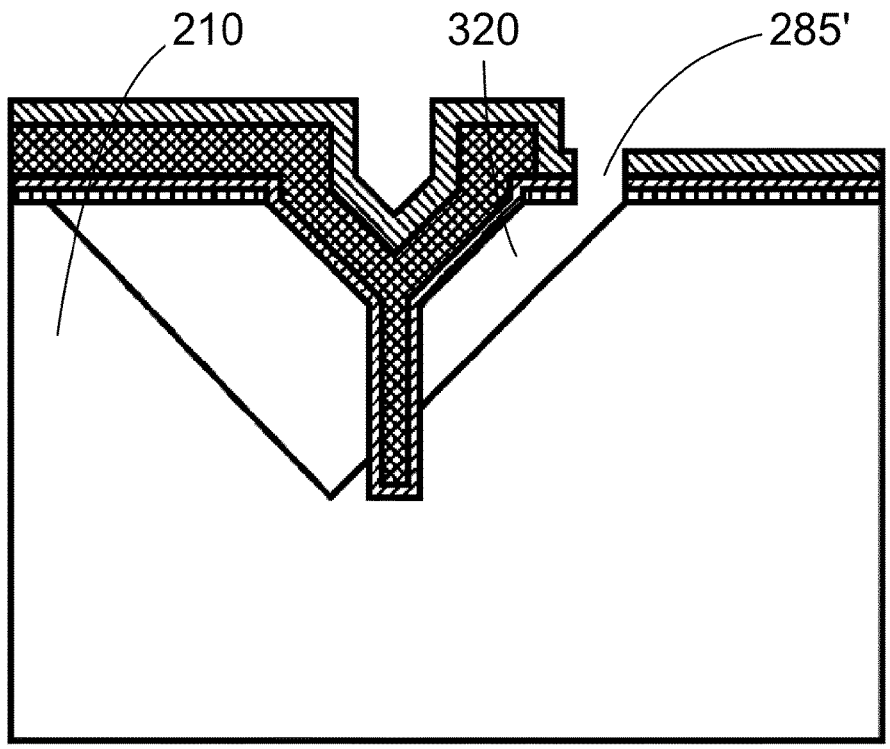

The stack of the structural silicon nitride layers 215', 260, 275 is patterned using standard Reactive Ion Etching to obtain an access hole 285' in said stacked silicon nitride layers, exposing the silicon substrate 210 (FIG. 3B).

Using the small opening 285', a pyramidal pit 320 bounded by the slow etching (111) crystallographic planes is formed by KOH etching (25% KOH at 75° C.). One side of the pyramidal pit 320 intersects with the filled cavity 250 (FIG. 3 C).

Figure 3D:
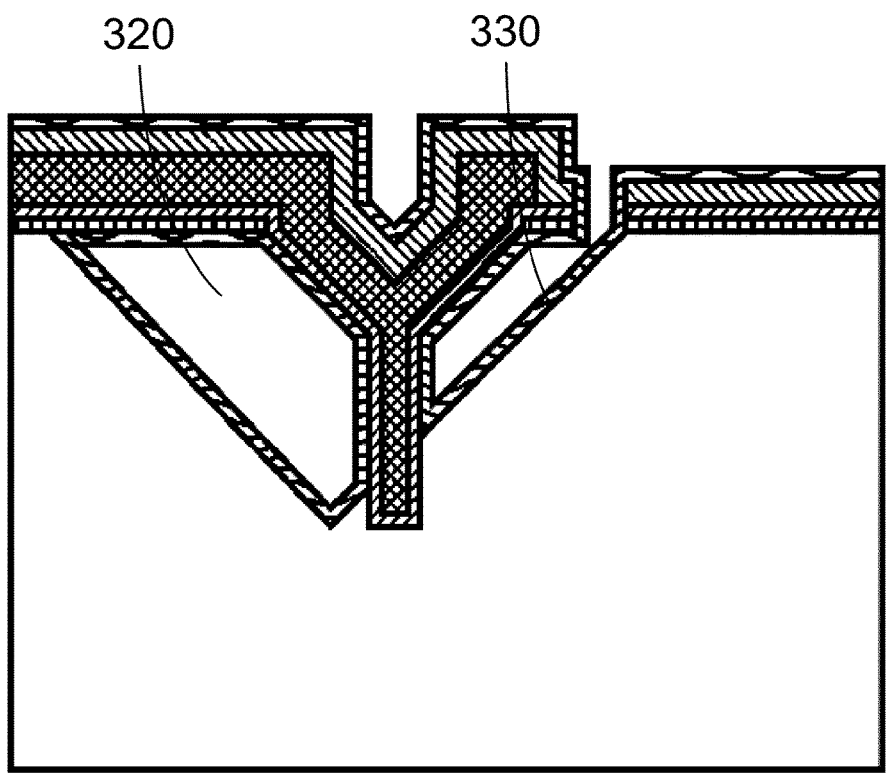

A thin layer of TEOS 330 (100 nm) is deposited (a protective layer) (FIG. 3D).

Figure 3E:
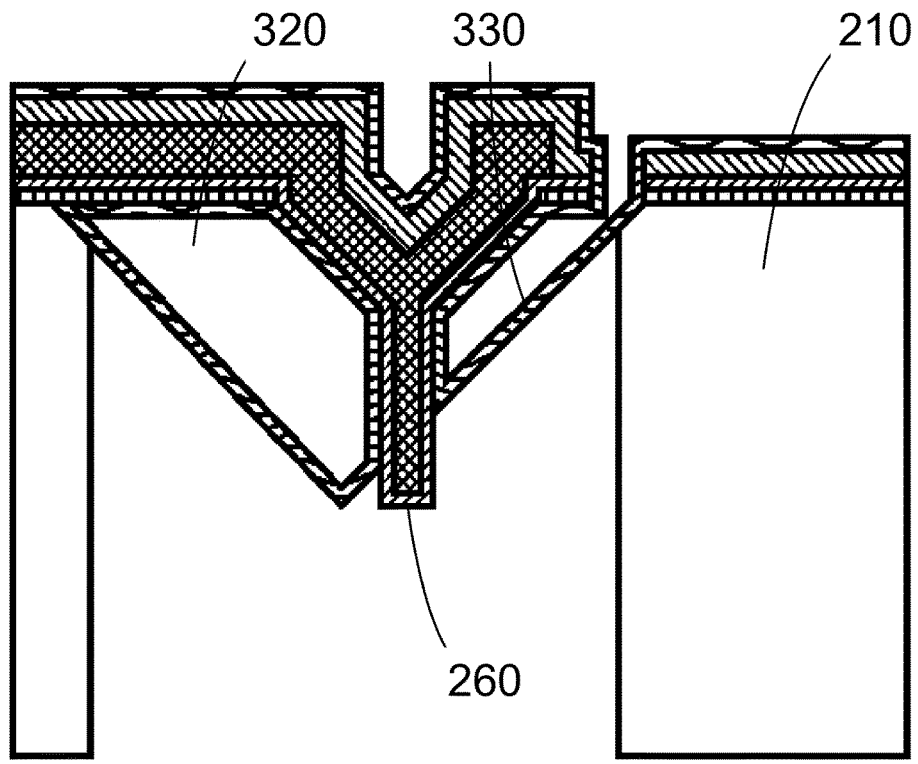

The bulk silicon of the substrate 210 around the pyramidal pit 320 is removed locally (after patterning) by TMAH etching (schematically shown in FIG. 3E).

Figure 3F:
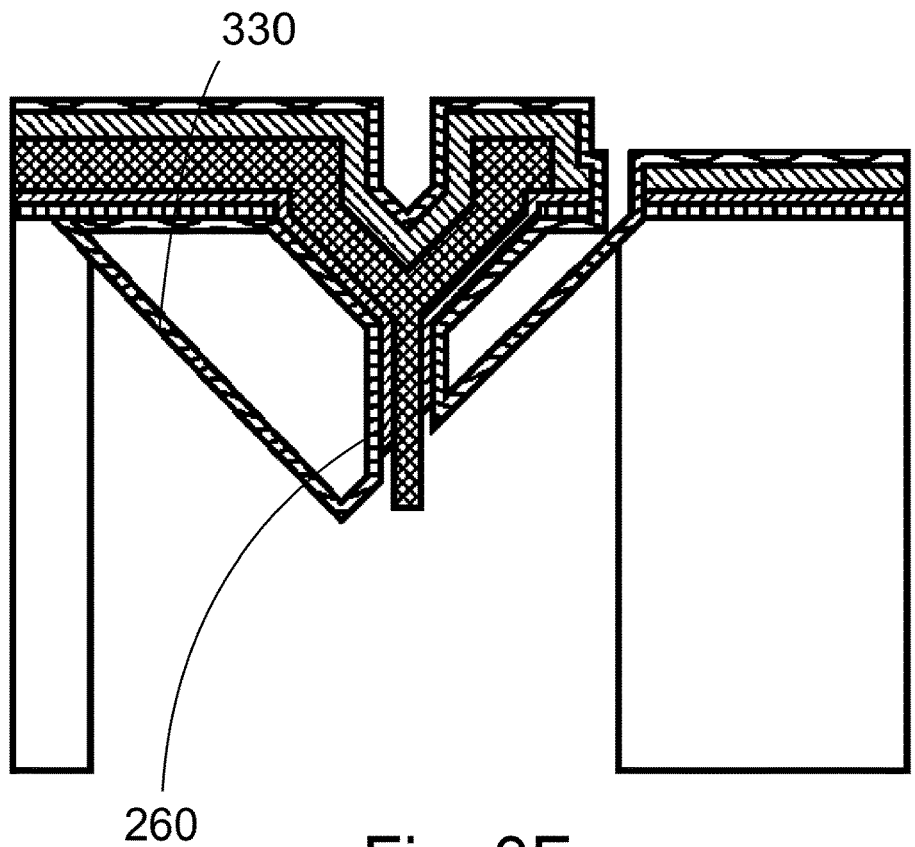

The exposed part of silicon nitride layer 260 at the distal end of the protrusion to be formed that extends into the pyramidal pit 320 is etched by wet chemical etching in hot phosphoric acid (85% at 180° C.) (FIG. 3F).

The procedure may be continued with a similar step as described for FIG. 2O. Using a mask and RIE etching, the layer stack of silicon oxide and silicon nitride is patterned to create the probe layout.

The procedure may then be continued with removal of the protective silicon oxide layer 330 using wet chemical etching in BHF as described for FIG. 2U, and onward.

The invention claimed is:

1. A method of manufacturing a MEMS device, said device comprising
　a main body, and
　a protrusion protruding from the main body;
　wherein the method comprises performing a series of steps on a monocrystalline wafer substrate, wherein the wafer substrate comprises a first main side and a second main side opposite of the first main side; wherein the steps comprise
　　creating a first recess in the wafer substrate at the first main side, said first recess comprising an upper recess section and a lower recess section, creating said first recess comprising
　　creating the upper recess section in the wafer substrate using anisotropic etching,
　　performing corner lithography, involving the steps of
　　providing a mask at the nadir of the upper recess section,
　　growing a cover layer inside the upper recess section and outside the mask,
　　removing the mask at the nadir, and
　　performing directional etching using the cover layer as a mask so as to form the lower recess section;
　　introducing filler material in the first recess,
　　forming a second recess in the wafer substrate adjacent to the first recess and at a side chosen from the first main side and the second main side, wherein creating said second recess comprises the following steps
　　performing anisotropic etching so as to form a cavity with a wall of said cavity intersecting the lower recess section of the first recess provided with filler material; and
　　using the plane of the wall to define a barrier and etching the filler material using said barrier, and
　　removing at least part of the wafer substrate material so as to expose the filler material introduced in the first recess.

2. The method of claim 1, wherein the monocrystalline substrate is silicon, and the corner lithography steps comprise
　for the step of providing the mask as the mask at the nadir of the upper recess section,
　depositing a silicon nitride layer, and
　performing corner lithography;
　for the step of growing a cover layer outside the mask at the nadir, performing thermal oxidation of silicon of the substrate; and
　for the step of removing the mask, at the nadir, selective etching of silicon nitride at the bottom of the upper recess section.

3. The method of claim 2, wherein the upper recess section is a pit, and the mask at the nadir is a masking dot.

4. The method of claim 3, wherein—before the step of forming the recess
　the silicon substrate is provided with a layer of silicon nitride and a cover layer of silicon oxide, and
　a mask is provided and locally the silicon oxide and silicon nitride are removed so as to expose the silicon of the wafer substrate locally, and
　the step of introducing filler material comprises introducing silicon nitride as the filler material.

5. The method of claim 4, wherein the step of introducing filler material comprises introducing silicon nitride as the filler material as a layer.

6. The method of claim 5, wherein the step of using the wall as a barrier comprises providing the cavity with an isotropic etchant to subject the filler material to isotropic etching.

7. The method of claim 6, wherein the step of using the wall as a barrier comprises providing the second recess with a barrier layer and subjecting the wafer substrate to etching so as to remove said wafer substrate material.

8. The method of claim 7, wherein to form the second recess the step of performing anisotropic etching so as to form the cavity is preceded by a step of performing directional etching locally.

* * * * *